United States Patent [19]

Cho et al.

[11] Patent Number: 5,434,814
[45] Date of Patent: Jul. 18, 1995

[54] CIRCUIT FOR REPAIRING DEFECTIVE READ ONLY MEMORIES WITH REDUNDANT NAND STRING

[75] Inventors: Sung-Hee Cho, Suwon; Kang-Deog Suh, Ahnyang; Hyong-Gon Lee; Jae-Yeong Do, both of Suwon, all of Rep. of Korea

[73] Assignee: Samsung Electronics Co., Ltd., Suwon, Rep. of Korea

[21] Appl. No.: 132,175

[22] Filed: Oct. 6, 1993

[30] Foreign Application Priority Data

Oct. 6, 1992 [KR] Rep. of Korea .................. 18250/92

[51] Int. Cl.⁶ ............................................. G11C 11/40
[52] U.S. Cl. ................................. 365/185; 365/200; 365/230.03; 365/203.06; 365/104
[58] Field of Search ............... 365/200, 230.03, 230.06, 365/185, 104

[56] References Cited

U.S. PATENT DOCUMENTS

| | | | |
|---|---|---|---|
| 4,783,764 | 11/1988 | Tsuchiya et al. | 365/230.06 |
| 4,924,438 | 5/1990 | Kobatake | 365/230.06 |
| 5,058,059 | 10/1991 | Matsuo et al. | 365/200 |
| 5,200,922 | 4/1993 | Rao | 365/200 |
| 5,206,831 | 4/1993 | Wakamatsu | 371/10.3 |
| 5,233,566 | 8/1993 | Imamiya et al. | 365/200 |
| 5,247,480 | 9/1993 | Itoh et al. | 365/185 |
| 5,289,417 | 2/1994 | Ooishi et al. | 365/230.03 |
| 5,297,084 | 3/1994 | Ban | 365/230.06 |
| 5,321,699 | 6/1994 | Endoh et al. | 365/185 |
| 5,323,039 | 6/1994 | Asano et al. | 365/185 |
| 5,329,488 | 7/1994 | Hashimoto | 365/200 |

FOREIGN PATENT DOCUMENTS 897341 5/1989 Rep. of Korea .

Primary Examiner—Joseph E. Clawson, Jr.
Attorney, Agent, or Firm—Charles R. Donohoe; Robert A. Westerlund, Jr.; Stephen R. Whitt

[57] ABSTRACT

A mask ROM having a defect repairing function stores address signals corresponding to a defective memory cell and then, selectively activates either a redundancy row decoder or a row decoder according to whether the address signals stored are identical to address signals supplied externally. The mask ROM includes first and second memory cell arrays formed by grouping in a word line direction a plurality of read only memory cells arranged in rows and columns; first and second row decoders for combining row address signals supplied externally so as to selectively drive the word lines of the first and second memory cell arrays; and a row decoder selector for storing therein address signals according to a row block including a defective memory cell, of the first memory cell array so as to inactivate the first row decoder and activate the second row decoder when the external row address signals are equal to the address signals stored in the row decoder selector.

4 Claims, 4 Drawing Sheets

CIRCUIT FOR REPAIRING DEFECTIVE READ ONLY MEMORIES WITH REDUNDANT NAND STRING

BACKGROUND OF THE INVENTION

The present invention relates to a read only memory (ROM), and more particularly to a circuit for repairing defects in a mask ROM. Mask ROMs have specific data stored therein during the manufacturing process. The mask ROMs are programmed during the manufacturing process to perform a specific operation and the predetermined data is stored by ion-implantation, contact switching, etc. A general mask ROM includes a redundancy memory cell array composed of redundant memory cells for replacing defective memory cells, repairing defective memory cells or programming data.

A conventional technique for repairing defects in a mask ROM has been disclosed in ISSCC, pp. 128-129, 1989 entitled "A 16Mb Mask ROM with Programmable Redundancy" by Yasuo Naruke, et al. The disclosed conventional defect repairing circuit uses as a redundancy memory cell a polysilicon fuse cell which can be electrically cut off. The defect is repaired by cutting off a selected fuse cell by allowing current flow therethrough. However, in this defect repairing technique, the size of the memory chip is increased since a polysilicon fuse cell is used as a redundancy cell. Accordingly, circuit integration is also decreased. Moreover, in the case where a normal memory cell array is not composed of fuse cells, an additional photoetching process is needed to form a redundancy memory cell array. Accordingly, the mask layers are essentially increased in number and the manufacturing cost becomes high.

SUMMARY OF THE INVENTION

Accordingly, it is an object of the present invention to provide a mask ROM having higher integration.

It is another object of the present invention to provide a mask ROM having a redundancy memory cell array having the same cell structure as that of a normal memory cell array.

It is still another object of the present invention to provide a mask ROM capable of repairing a defective chip without increasing the number of photoetching masks.

It is a further object of the present invention to provide a mask ROM capable of repairing defective memory cells by replacing rows or row blocks.

To achieve the above objects, a read only memory according to the present invention has been provided with first and second memory cell arrays formed by grouping, in a word line direction, a plurality of read only memory cells arranged in rows and columns. The first and second memory cell arrays share bit lines and a plurality of word lines and bit lines extend along the rows and columns, respectively. First and second row decoders are provided for combining row address signals supplied externally so as to selectively drive the word lines of the first and second memory cell arrays, respectively. A row decoder selector is provided for storing therein address signals, according to a row block including a defective memory cell, of the first memory cell array so that the first row decoder is inactivated and the second row decoder is activated when the external row address signals are equal to the address signals stored in the row decoder selector. Thus, the first memory cell array operates as a main memory cell array and the second memory cell array operates as a redundancy memory cell array for replacing a defective memory cell in the first memory cell array. Further, the row decoder selector stores address signals corresponding to a row block which includes the defective memory cell in the first memory cell array. When received external address input signals are not equal to the address signals stored, the row decoder selector activates the first row decoder. However, when the external address signals are equal to the stored address signals, the row decoder selector activates the second row decoder. Moreover, the second memory cell array shares bit lines with the first memory cell array and stores data corresponding to a defective memory cell of the first memory cell array in a row unit or in a block unit.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE PREFERRED EMBODIMENT

Figure 1:
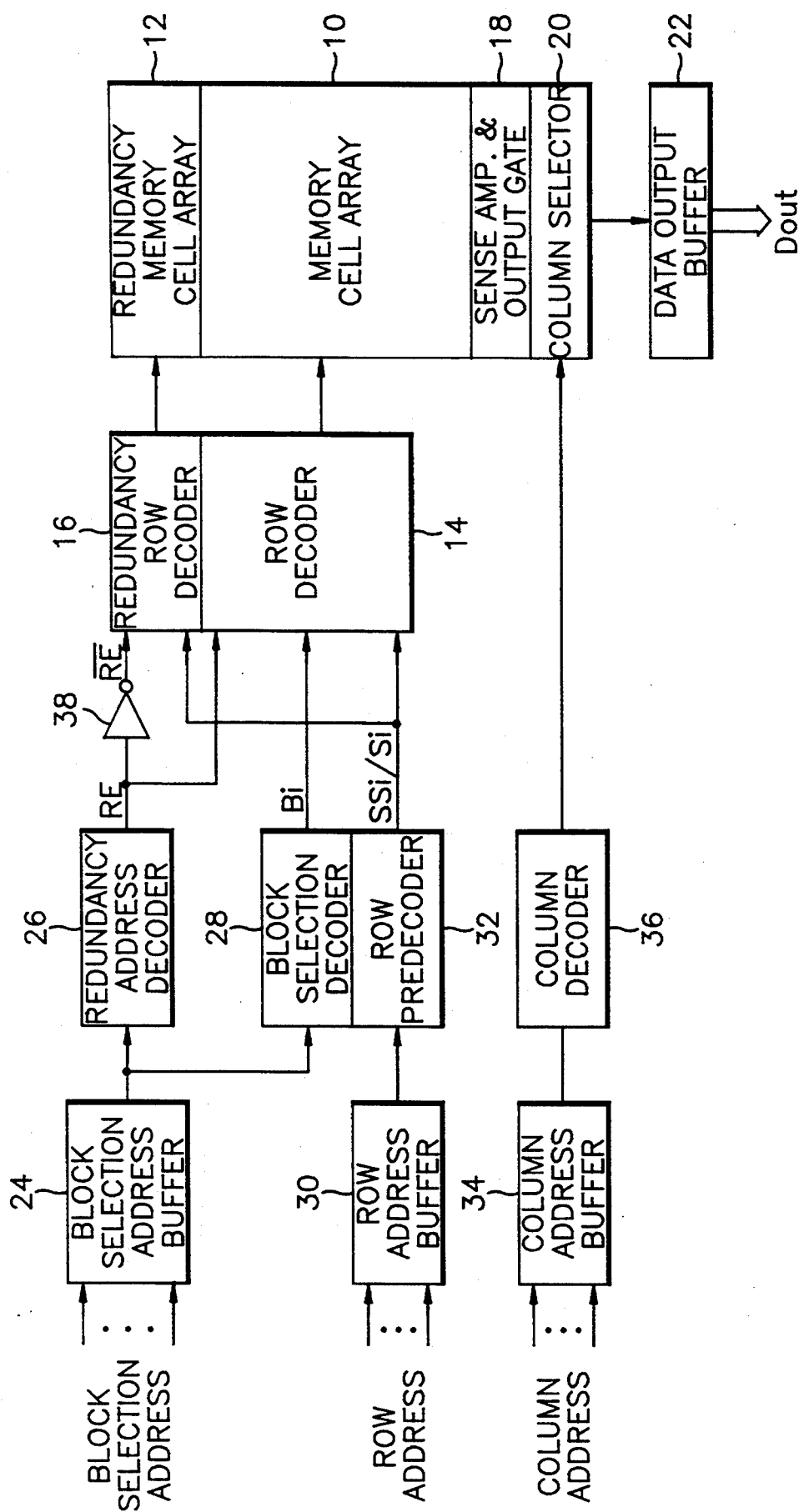
FIG. 1 is a functional block diagram of a mask ROM having a defect repairing circuit according to the present invention.

FIG. 1 illustrates in block diagram form a mask ROM having a redundancy memory cell array for replacing defective memory cells by rows or by blocks. The memory includes memory cell array 10 composed of main memory cells, and redundancy memory cell array 12 composed of redundancy memory cells used for repairing defects. Word lines of memory cell array 10 are selectively driven by row decoder 14, and word lines of redundancy memory cell array 12 are selectively driven by redundancy row decoder 16. Memory cell array 10 and redundancy memory cell array 12 are formed by dividing a memory cell array in the word line direction. Accordingly, memory cells 10 and 12 have the same memory cell structure, and share bit lines for data output. Read data on each bit line is sensed and amplified by a sense amplifier formed within sense amplifier & output gate 18. A selected one of the output gates is turned on by column selector 20, so that the read data is transferred to data output buffer 22. Memory cell array 10 has the memory cells in a NAND cell structure, as shown in FIG. 2.

Figure 2:
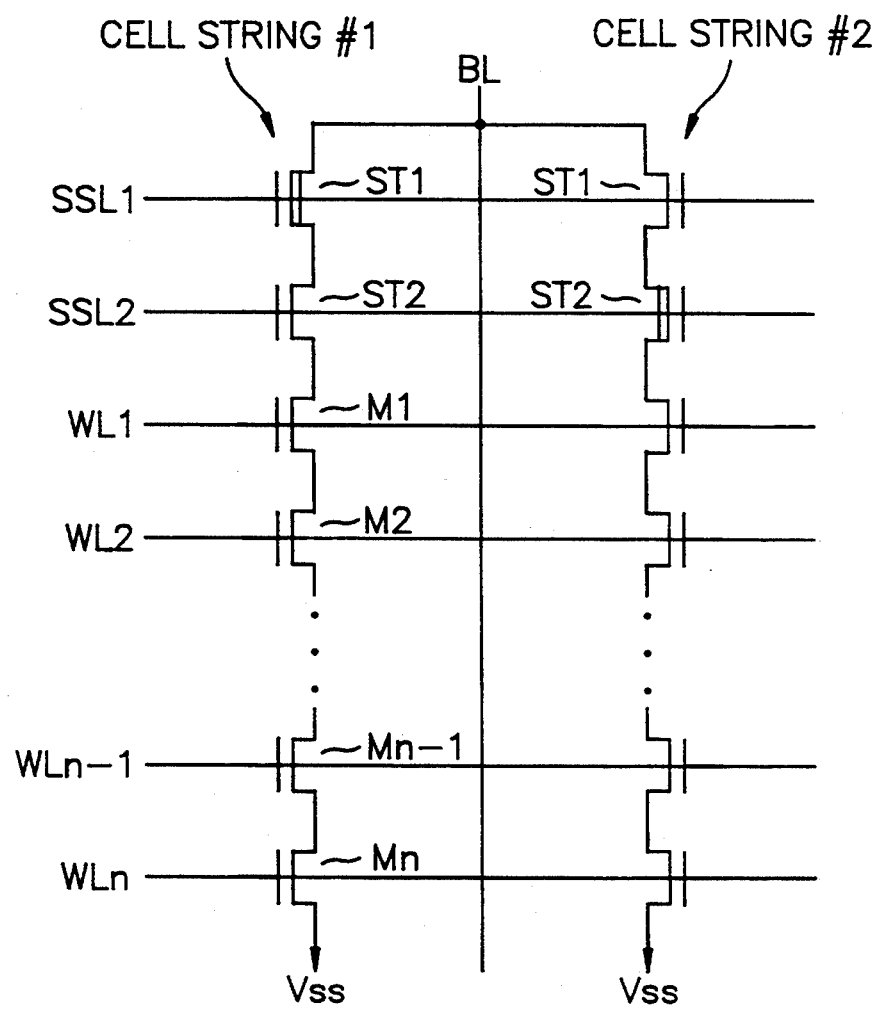
FIG. 2 is a circuit diagram partially showing a memory cell array (10) shown in FIG. 1.

Also as shown in FIG. 2, a NAND cell string has two serially connected string selection transistors ST1 and ST2, and n memory cell transistors M1 to Mn. First and second memory cell strings share a common bit line BL. The gates of string selection transistors ST1 and ST2 are connected to string selection lines SSL1 and SSL2, respectively. The gates of memory cell transistors M1 to Mn are connected to word lines WL1 to WLn, respectively. The string selection transistors and the memory cell transistors are first manufactured as enhancement type transistors and thereafter, desired ones of them are converted into depletion type transistors by implanting ions into channel regions thereof, thereby storing data.

In FIG. 2, in the first memory cell string, the string selection transistor ST1 is manufactured as a depletion type transistor and string selection transistor ST2 is manufactured as an enhancement type transistor. However, in the second memory cell string, string selection transistors ST1 and ST2 are manufactured as an enhancement type transistor and a depletion type transistor, respectively. Accordingly, when word lines SSL1 and SSL2 are respectively supplied with "low" and "high" level signals, string selection transistors ST1 and ST2 of the first memory cell string are all turned on, but string selection transistor ST1 of the second memory cell string is turned off and only string selection transistor ST2 of the second memory cell string is turned on, so that only the first memory cell string is connected to the bit line to perform a data reading operation.

Each of the NAND cell strings of the present embodiment as shown in FIG. 2, have two string selection transistors ST1 and ST2 whose gates are respectively connected to string selection lines SSL1 and SSL2. In other embodiments, more string selection transistors can be provided. In such cases, it is necessary that the number of string selection lines should be the same as the number of string selection transistors (refer to Korean Patent Application No. 89-7341 filed on May 31, 1989 by the same assignee, where a NAND string of a mask ROM is described in detail). The memory cell strings arranged in a row direction and controlled by the string selection lines SSL1 and SSL2 form one row block.

As depicted in FIG. 1, block selection address signals supplied from outside the memory device are received by block selection address buffer 24 and are commonly fed to redundancy address decoder 26 and block selection decoder 28. Row address signals are received by row address buffer 30 and are fed to row predecoder 32. Column address signals are received by column address buffer 34 and then fed to column decoder 36. Block selection decoder 28 combines the received block selection address signals to select and activate one of the row blocks within memory cell array 10.

Redundancy address decoder 26 stores an address signal corresponding to a row block including a defective NAND cell string among row blocks within the memory cell array 10 and generates a redundancy enable signal RE having a logic "high" level if the block selection address signals supplied from the block selection address buffer 24 are identical to the address signals stored therein and, otherwise, generates an RE signal having a logic "low" level. The redundancy enable signal RE is fed to an operation control terminal of row decoder 14 and an inverted redundancy enable signal $\overline{RE}$ is fed to the operation control terminal of redundancy row decoder 16 through inverter 38. The structures of row decoder 14 and redundancy row decoder 16 are, respectively, shown in FIGS. 4 and 5.

Figure 4:
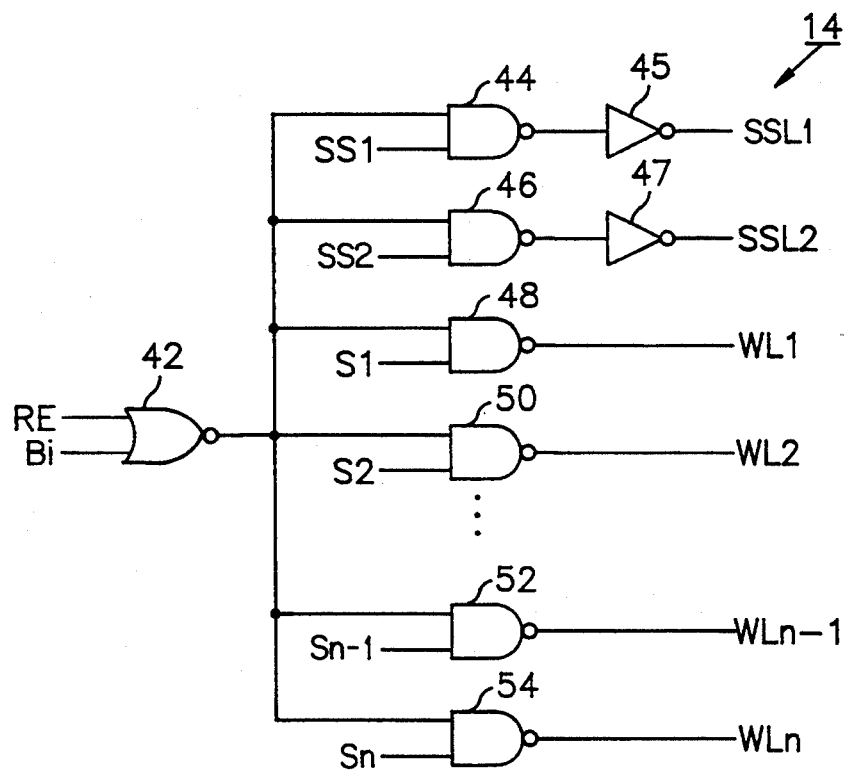
FIG. 4 is a circuit diagram showing an embodiment of a row decoder (14) shown in FIG. 1.

As shown in FIG. 4, NOR gate 42 receives a block selection signal Bi (from block selection decoder 28) and redundancy enable signal RE (from redundancy address decoder 26). Accordingly, when the redundancy enable signal RE is at a "low" logic level and the block selection signal Bi is at a "low" logic level the output of NOR gate 42 is at a "high" logic level. The output of NOR gate 42 is commonly supplied to respective input terminals of NAND gates 44 to 54. The other input terminals of each NAND gate 44 to 54 receiving one of the string selection signal SS1, string selection signal SS2, or word line driving signals S1 to Sn. The outputs of NAND gates 44 and 46 are connected to inverters 45 and 47, respectively. The outputs of inverters 45 and 47 are connected to string selection lines SSL1 and SSL2, respectively. Also, the output of NAND gates 48 to 54 are connected to word lines WL1 to WLn, respectively. Accordingly, only when the output of the NOR gate 42 which is input to the respective NAND gates 44 to 54, maintains a "high" logic level will the string selection signals and the word line driving signals become effective. Accordingly, the operation of row decoder 14 is activated when block selection signal Bi and redundancy enable signal RE are both at a "low" logic level.

Figure 5:
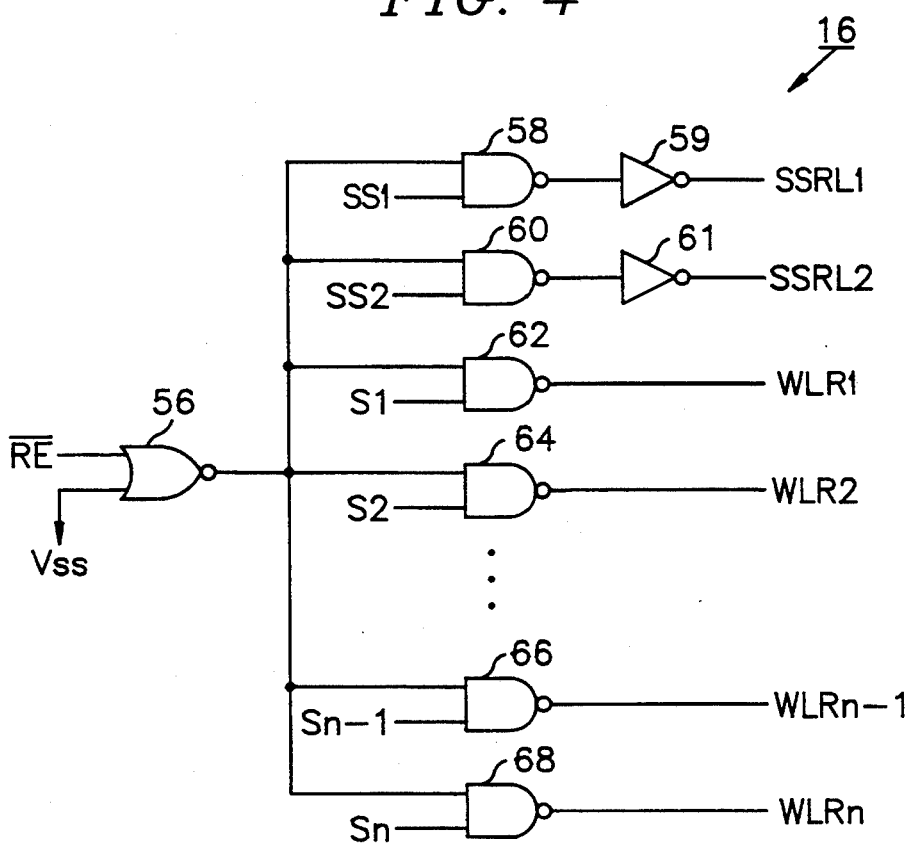
FIG. 5 is a circuit diagram showing an embodiment of a redundancy row decoder (16) shown in FIG. 1.

As can be seen from FIG. 5, the structure of redundancy row decoder 16 is very similar to that of row decoder 14. NOR gate 56 receives the inverted redundancy enable signal $\overline{RE}$ and a ground reference voltage Vss. The output of NOR gate 56 is commonly fed to respective input terminals of NAND gates 58 to 68. The other input terminals of NAND gates 58 to 68 receive one of the string selection signal SS1, string selection signal SS2, or word line driving signals S1 to Sn. The outputs of NAND gates 58 and 60 are connected to inverters 59 and 61, respectively. The outputs of inverters 59 and 61 are connected to redundancy string selection lines SSRL1 and SSRL2, respectively. Also, the output nodes of NAND gates 62 to 68 are connected to redundancy word lines WLR1 to WLRn, respectively. Accordingly, only when the output of NOR gate 56, which is input to the respective NAND gates 58 to 68, maintains a "high" logic level will the string selection signals and the redundancy word line driving signals become effective. Accordingly, redundancy row decoder 16 is activated in a redundancy mode when the redundancy enable signal RE is at a "high" logic level (i.e., the $\overline{RE}$ signal is at a "low" logic level).

Redundancy address decoder 26 shown in FIG. 1, stores the address signals corresponding to a row block including a defective memory cell among the row blocks within the memory cell array 10, and receives a block selection address signal supplied from block selection address buffer 24. At this time, when the received block selection address signals are different from the address signals stored in the redundancy address decoder 26, the row decoder 14 is activated, and when the received block selection address signals are equal to the address signals stored in the redundancy address decoder 26, the redundancy row decoder 16 is activated. An embodiment of the redundancy address decoder 26 according to the present invention is illustrated in FIG. 3.

Figure 3:
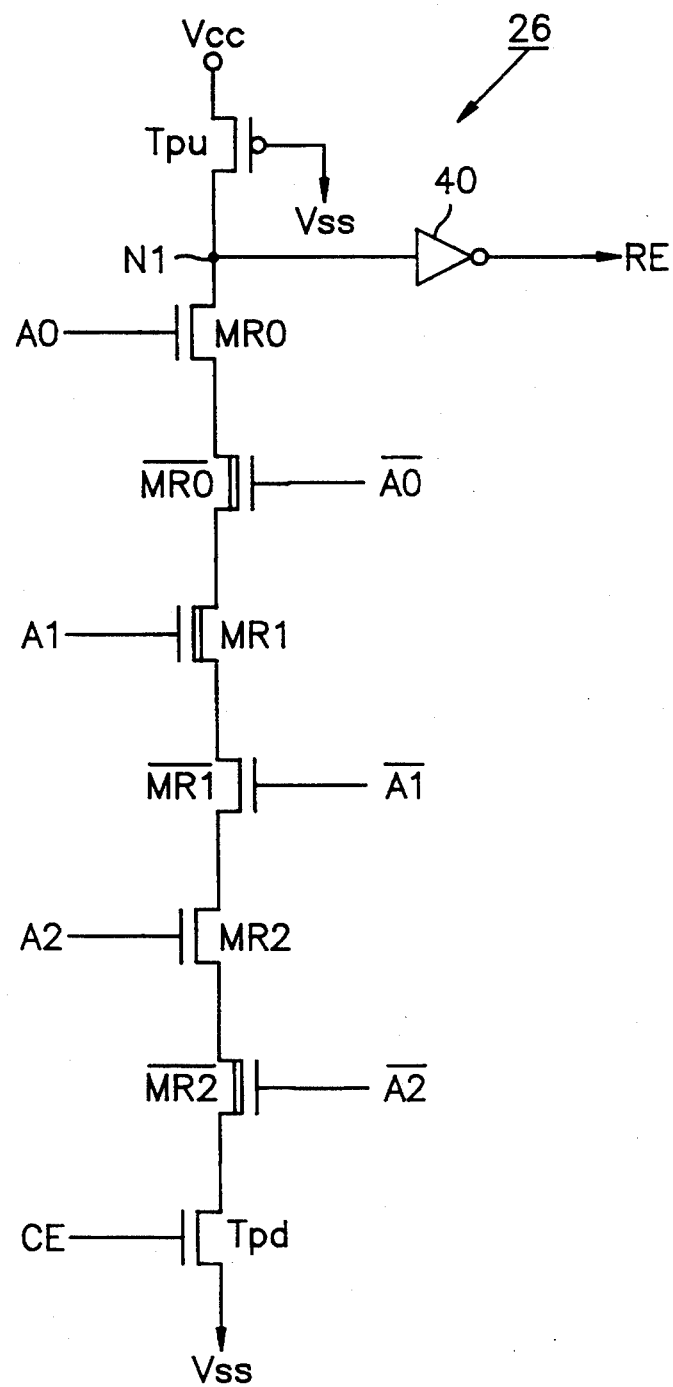
FIG. 3 is a circuit diagram showing an embodiment of a redundancy address decoder (26) in FIG. 1 according to the present invention.

As shown in FIG. 3, redundancy address decoder 26 has a PMOS transistor Tpu whose channel is connected between the supply voltage Vcc and an output node N1. First to seventh NMOS transistors MR0, $\overline{MR0}$, MR1, $\overline{MR1}$, MR2, $\overline{MR2}$ and Tpd have channels which are serially connected between the output node N1 and the ground reference voltage Vss. Inverter 40 is connected to the output node N1 for generating the redundancy enable signal RE. The PMOS transistor Tpu acts as a pull-up means for the output node and the NMOS transistor Tpd acts as a pull-down transistor. Block selection addresses signals A0–A2 and their inverted addresses signals $\overline{A0}$–$\overline{A2}$ are fed to corresponding gates of the first to sixth NMOS transistors MR0, $\overline{MR0}$, MR1, $\overline{MR1}$, MR2, and $\overline{MR2}$. The gate of the seventh NMOS transistor Tpd is supplied with chip enable signal CE. Since the gate of the seventh NMOS transistor Tpd is controlled by chip enable signal CE, current consumption in a stand-by state can be prevented.

The address signals of a row block including a defective memory cell within the memory cell array are stored in the first to sixth NMOS transistors. For example, if a defective row block is located in an area corresponding to the block selection address signals A0, A1 and A2 of "101", the first to sixth NMOS transistors should be made such that the NMOS transistors MR0, $\overline{MR1}$, MR2 become the enhancement type and the remaining NMOS transistors $\overline{MR0}$, MR1, $\overline{MR2}$ become the depletion type by implanting ions into the channels thereof, thereby storing the address "101" of the row block including the defective memory cell. For such a purpose, ion implantation is performed into gates of the second, third and sixth NMOS transistors $\overline{MR0}$, MR1, and $\overline{MR2}$ connected to the address signals $\overline{A0}$, A1 and $\overline{A2}$ using the well known ion-beam lithography technique, thereby converting to the depletion type, transistors that were initially manufactured as the enhancement type. Accordingly, if the chip enable signal CE is at a "high" logic level and the row address signals A0, A1 and A2 of "101" are supplied, then the first to seventh NMOS transistors are all turned on. Accordingly, the output node N1 is discharged to the ground reference voltage Vss, so that the inverter 40 connected to the output node N1 generates the enable signal RE at the "high" logic level. In FIG. 3, three block selection address signals A0–A3 are used as an example, but the number of address signals can be varied as necessary.

The defect repairing operation of the mask ROM shown in FIG. 1 will now be described with reference to FIGS. 2 through 5. If the presence of a defective memory cell is identified by performing an EDS (Electrical Die Sorting) test after the manufacturing and data programming processes are completed, the address signals of a row block including the defective memory cell are stored in block selection address decoder 26, and data to be stored in all memory cells within the row block including the defective memory cell is stored to the corresponding redundancy memory cells of redundancy memory cell array 10. In a general manufacturing process, the mask ROM is manufactured such that a plurality of chips are integrated on a wafer, and some of them can be defective. If a defective chip is found, its address near the detected portion within the defective chip and the initially recorded data are identified. Then, a photosensitive film is formed on the overall wafer. Openings are formed in a corresponding memory cell of the redundancy memory cell array, to store defect repairing data, and a corresponding transistor of redundancy address decoder 26, to store the address signals of the defected row block, using ion-beam lithography which is a well known technique. The defect repairing data and the address signals of the defected row block are recorded by implanting ions through the openings to convert the initial enhancement type transistor into a depletion type transistor. Since the ion-beam lithography art can form an opening by selectively etching a part on a wafer on which a photosensitive film is formed, ion-implantation can be done only into the selected portion. If recording of the defect repairing data is completed, a repair test is performed. At this time, if there still exists a defective memory cell after the initial defect repairing, the defect repairing can be again performed.

A data reading operation of the mask ROM will now be described. First, when the block selection address signals are supplied to assign a normal row block not having defective memory cells, the redundancy enable signal RE is at the "low" logic level and is supplied from the redundancy address decoder 26. Accordingly, row decoder 14 is activated and redundancy row decoder 16 is inactivated. Therefore, one row block within memory cell array 10 is selected by block selection decoder 28, and row decoder 14 receives string selection signals SSi and word line driving signals Si from row predecoder 32 to select a cell string and selectively drive the word lines of the selected row block. As a result, data read out from the selected cell string and loaded on the bit line is sensed and amplified by sense amplifier 18 and is transferred to data output buffer 22 through the output gate selected by the column address, thereby being supplied externally to the memory. On the other hand, if the block selection address signals are supplied to assign a row block including a defective memory cell, the redundancy enable signal RE supplied from the redundancy address decoder 26 is at the "low" logic level and, accordingly, row decoder 14 is inactivated and the redundancy row decoder 16 is activated. As a result, redundancy row decoder 16 receives string selection signal SSi and word line driving signal Si from row predecoder 32 to select a cell string of redundancy memory cell array 12 and selectively drive the word lines. Accordingly, the data read out from the selected cell string and loaded on the bit line is sensed and amplified by sense amplifier 18 and is transferred to data output buffer 22 through the output gate selected by the column address, thereby being supplied externally to the memory.

As described above, the mask ROM according to the present invention can form a redundancy memory cell array having the same cell structure as that of memory cell array, instead of fuse cells generally used as a redundancy memory cell. Accordingly, since memory cell array and redundancy memory cell array can be manufactured at the same time, high integration of the chip can be achieved and also the redundancy memory cell array for defect repairing can be easily expanded.

Also, a redundancy memory cell array and a memory cell array have a redundancy row decoder and a row decoder, respectively, and the provision of the redundancy row decoder allows the redundancy row decoder and the row decoder to be complimentarily operated. Accordingly, defect repairs can be done in units of a row or a row block.

Moreover, since the repair is performed using the ion-beam lithography technique, the problem resulting from increased mask layers according to photoetching to form a redundancy memory cell array in the conventional art is solved, thereby providing a mask ROM having a lowered manufactured cost. Accordingly, defects can be easily repaired and yield is greatly improved.

The foregoing description shows only a preferred embodiment of the present invention. Various modifications will be apparent to those skilled in the art without departing from the scope of the present invention which is only limited by the appended claims. Therefore, the embodiment shown and described is only illustrative, not restrictive.

What is claimed is:

1. A read only memory comprising: first and second memory cell arrays each including a plurality of row blocks, each of said row blocks comprising:
   a first and second plurality of read only memory cells each arranged in a column direction, said first and second plurality of read only memory cells sharing a bit line in a column direction, a plurality of word lines extending along rows of said first and second plurality of read only memory cells;
   first and second row decoders for combining a row address signal, said first and second row decoders selectively driving said plurality of word lines; and
   row decoder selecting means for storing therein a plurality of addresses corresponding to ones of said plurality of row blocks including a defective memory cell in respective ones of said first memory cell array, said row decoder selecting means inactivating said first row decoder and activating said second row decoder when said row address signal is equal to an address stored in said row decoder selecting means.

2. A read only memory as claimed in claim 1, wherein said row decoder selecting means comprises:
   an output node connected between a power supply voltage and a ground reference voltage, for generating a row decoder selection signal;
   at least two n-channel MOS transistors having drain-source channels connected in series between said output node and said ground reference voltage and having gates connected to respective bits of said row address signal; and
   at least one of said n-channel MOS transistors being a depletion type MOS transistor.

3. A read only memory comprising:
   first and second memory cell arrays each including a plurality of row blocks, each of said row blocks comprising:
   a first and second plurality of read only memory cells each arranged in a column direction, said first and second plurality of read only memory cells sharing a bit line in a column direction, a plurality of word lines extending along rows of said first and second plurality of read only memory cells;
   a block selection decoder for combining a block selection address signal to generate a block selection signal for selecting one of said plurality of row blocks;
   first and second row decoders for combining a row address signal, said first and second row decoders selectively driving said plurality of word lines; and
   row decoder selecting means for storing therein a plurality of addresses corresponding to ones of said plurality of row blocks including a defective memory cell in respective ones of said first memory cell array, said row decoder selecting means inactivating said first row decoder and activating said second row decoder when said row address signal is equal to an address stored in said row decoder selecting means.

4. A read only memory as claimed in claim 3, wherein said row decoder selecting means comprises:
   an output node connected between a power supply voltage and a ground reference voltage, for generating a row decoder selection signal;
   at least two n-channel MOS transistors having drain-source channels connected in series between said output node and said ground reference voltage and having gates connected to said row address signals; and
   at least one of said n-channel MOS transistors being a depletion type MOS transistor.

* * * * *